United States Patent
Pavani et al.

(10) Patent No.: US 7,172,184 B2
(45) Date of Patent: Feb. 6, 2007

(54) SUBSTRATE CARRIER FOR ELECTROPLATING SOLAR CELLS

(75) Inventors: Luca Pavani, Fermo (IT); Neil Kaminar, Boulder Creek, CA (US); Pongsthorn Uralwong, Campbell, CA (US); Thomas Phu, Alameda, CA (US); Douglas H. Rose, Austin, TX (US); Thomas Pass, San Jose, CA (US)

(73) Assignee: Sunpower Corporation, San Jose, CA (US)

( * ) Notice: Subject to any disclaimer, the term of this patent is extended or adjusted under 35 U.S.C. 154(b) by 71 days.

(21) Appl. No.: 10/912,348

(22) Filed: Aug. 4, 2004

(65) Prior Publication Data

US 2005/0061665 A1 Mar. 24, 2005

Related U.S. Application Data

(60) Provisional application No. 60/492,828, filed on Aug. 6, 2003.

(51) Int. Cl.
*B25B 11/02* (2006.01)
*C25D 17/06* (2006.01)

(52) U.S. Cl. .............. 269/37; 269/40; 269/41; 269/42; 269/43; 269/44; 269/95; 269/287; 269/303; 269/900; 204/297.06; 204/297.07; 204/297.09; 204/297.1

(58) Field of Classification Search .......... 269/37, 269/40, 41, 42, 43, 44, 95, 287, 303, 900; 204/297.06, 297.07, 297.09, 297.1
See application file for complete search history.

(56) References Cited

U.S. PATENT DOCUMENTS

| | | | | |
|---|---|---|---|---|
| 3,612,243 A | | 10/1971 | Marion et al. ............. 198/19 |
| 4,752,371 A | * | 6/1988 | Kreisel et al. ............ 204/297.1 |
| 4,986,778 A | * | 1/1991 | Liken et al. ................ 439/74 |
| 5,580,432 A | * | 12/1996 | Shibata et al. ............ 204/297.1 |
| 6,553,644 B2 | * | 4/2003 | Karmaniolas et al. ........ 29/559 |
| 2004/0200520 A1 | | 10/2004 | Diamond .................. 136/256 |

* cited by examiner

Primary Examiner—Bruce F. Bell
(74) Attorney, Agent, or Firm—Beyer Weaver & Thomas LLP (57) ABSTRACT

A carrier for use in processing of a plurality of wafers or other substrates includes a support frame on which the wafers are mounted and in one embodiment at least one auxiliary frame for holding the substrates on the support frame. A plurality of clips extend from the auxiliary frame and engage the substrates in pressure engagement, and fasteners retain the auxiliary frame in position with respect to the support frame. In one embodiment two auxiliary frames can be employed for holding wafers on opposing surfaces of the support frame. The support frame has electrically non-conducting surfaces whereby the processing does not affect the support frame, and the auxiliary frame is made of electrically non-conductive material. The clips are electrically conductive and bridge current from the support frame to the wafers during plating operations. In another embodiment, auxiliary frame are not used and the wafer retention clips are mounted on the support frame. In use, the carrier can support a high number of units for processing with no significant mechanical stress being transferred to the wafers during loading and unloading from the carrier. The carriers and wafers can be transferred easily for different chemical baths and can be handled safely during rinsing and drying steps.

34 Claims, 12 Drawing Sheets

SUBSTRATE CARRIER FOR ELECTROPLATING SOLAR CELLS

CROSS REFERENCE TO RELATED APPLICATIONS

This patent application claims the benefit of Provisional Patent Application Ser. No.: 60/492,828, filed Aug. 6, 2003, which is incorporated herein by reference for all purposes.

BACKGROUND OF THE INVENTION

This invention relates generally to the fabrication of devices in semiconductor wafers, such as photovoltaic cells, and more particularly the invention relates to a carrier for holding a plurality of wafers for electroplating, such as during electroplating of conductive material.

The automated processing of printed circuit boards and semiconductor wafers has long been employed in fabricating substrates for electrical applications. See, for example, U.S. Pat. No. 3,612,243 for MATERIAL HANDLING APPARATUS. Co-pending application Ser. No. 10/412,711, filed Apr. 10, 2003, for METAL CONTACT STRUCTURE FOR SOLAR CELL AND METHOD OF MANUFACTURE describes a unique contact structure employing a multi-metal seed layer on which a thicker electrically conductive metal is plated in forming electrical contacts and interconnect lines.

Such processing requires a substrate carrier in which a plurality of substrates can be readily loaded and unloaded without the transfer of any significant stress to the substrates. The substrates must be held firmly in position and easily transferred in different chemical baths and safely handled during rinsing and drying steps. Further, electrical current must be uniformly transferred and distributed from the carrier to the substrates during metal electroplating.

The present invention provides such a substrate carrier.

SUMMARY OF THE INVENTION

In accordance with one embodiment of the invention, a carrier for a plurality of wafers or other substrates for electroplating includes a support frame or jig of conductive material that carry the wafers, a plurality of contact clips of conductive material for holding the wafers on the support frame, and one or more auxiliary frames or jigs that carry the clips.

In operation, a first plurality of wafers is loaded on one side of the support frame and a second plurality of wafers can be loaded on an opposing side of the support frame with the auxiliary frames assembled to hold the wafers on the support frame. The conductive clips mounted on the auxiliary frames or jigs bridge electrical current from defined locations on the carrier frame to the wafers. The clips also function to keep wafers in position with their spring action. The support frame can include openings with tabs or flanges projecting therein for receiving the wafers. The openings permit space between wafers for the flow of electrolyte or other chemical solution. Alternatively, inserts configured to receive the wafers can be pressed or otherwise placed in the openings in the support frame thereby simplifying the frame construction.

In one embodiment, the support frame is preferably made of a conductive material and is coated with a non-conductive material whereby a plating process does not affect its surface. The support frame and auxiliary frames are maintained in assembly by suitable fasteners such as screws which also facilitate the loading and unloading of the wafers. The support frame provides a path for electrical current to flow to the wafers.

In alternative embodiments, the auxiliary frames can be conductive and provide a path for electrical current to flow to all the wafers through the contact fingers. In an alternative embodiment, the auxiliary frames are not required and the conductive clips or contact fingers are attached to the support frame and engage the wafers for retention on the support frame. In this design as well as other embodiments, the support fingers comprise torsion spring, coil spring, upset design or cantilever design with one end mounted to the support frame or auxiliary frame and the other end contacting the wafers.

The invention and objects and features thereof will be more readily apparent from the following detailed description and appended claims, when taken with the drawings.

DETAILED DESCRIPTION OF ILLUSTRATIVE EMBODIMENTS

Figure 1:
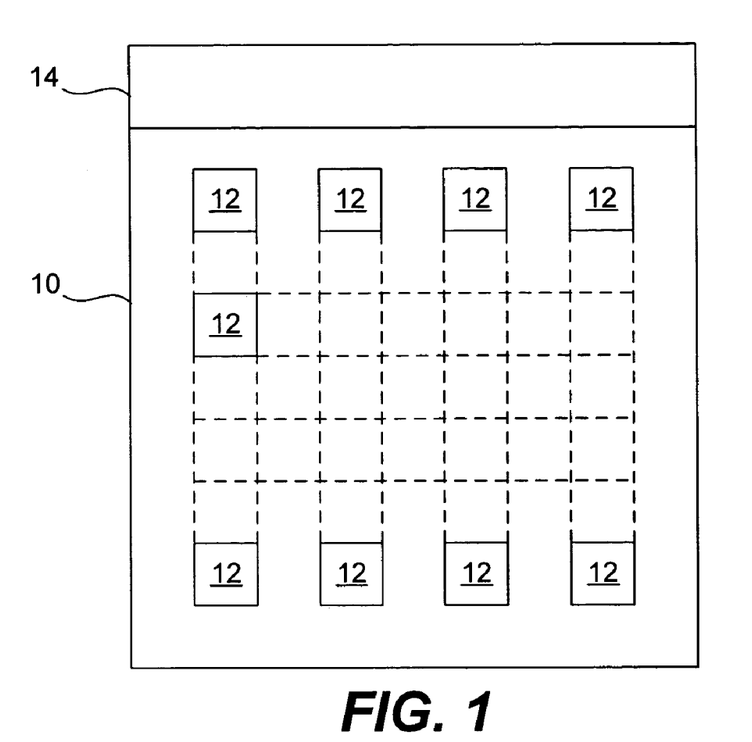
FIG. 1 is a perspective view of a wafer carrier loaded with a plurality of wafers in accordance with one embodiment of the invention.

FIG. 1 is a perspective view of a substrate carrier loaded with a plurality of wafers in accordance with one embodiment of the invention. The carrier includes a support frame 10 on which are mounted a plurality of wafers 12 typically arranged in rows and columns. Frame 10 is made of a conductive metal such as Kovar which is coated with a plastic material to prevent chemical reactions of the frame in the various chemical baths utilized in fabricating devices on wafers 12, such as copper and tin plating. An upper portion 14 of carrier 10 can be gripped by loading and unloading apparatus at each chemical bath. Support clips for holding wafers 12 on frame 10 also conduct electrical current from the frame to the wafers as required in plating operations, for example.

Figure 2:
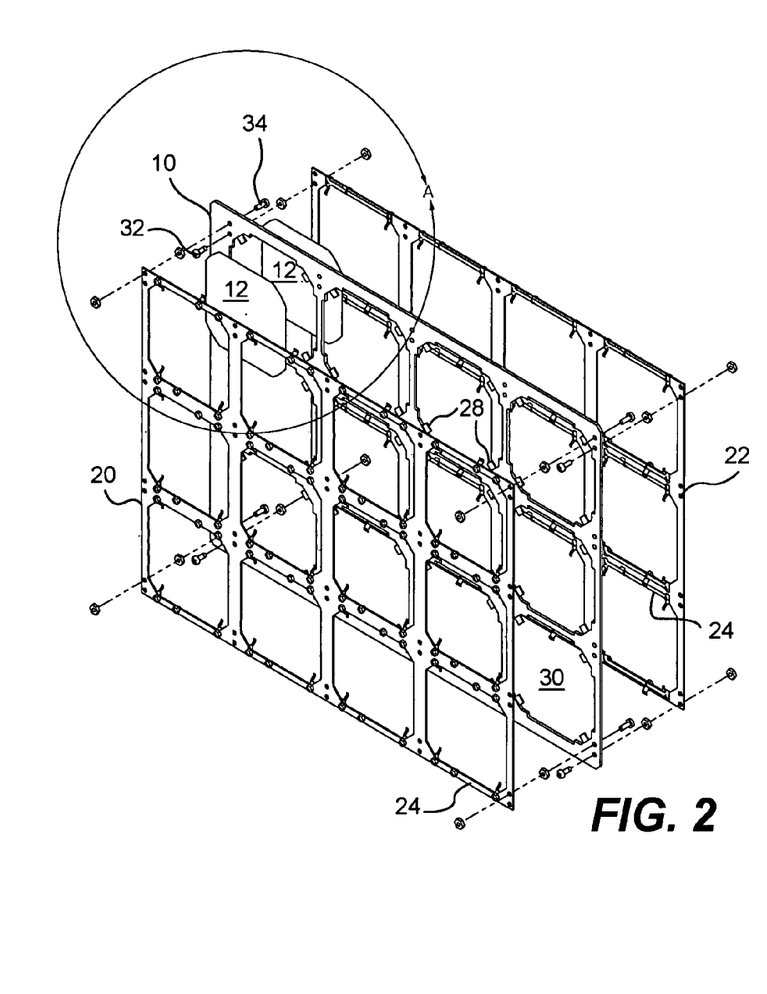
FIG. 2 is an exploded perspective view of the substrate carrier in FIG. 1.

FIG. 2 is an exploded perspective view of the substrate carrier of FIG. 1 and further illustrates auxiliary frames 20, 22 which hold wafers 12 on a front surface and a back surface of support frame 10. Only two wafers are illustrated in this embodiment, however, it will be appreciated that a plurality of rows and columns of wafers can be supported on frame 10 as shown in FIG. 1. In one embodiment, twenty-four wafers are carried on the frame with two auxiliary frames having forty-eight clips.

Figure 1A:
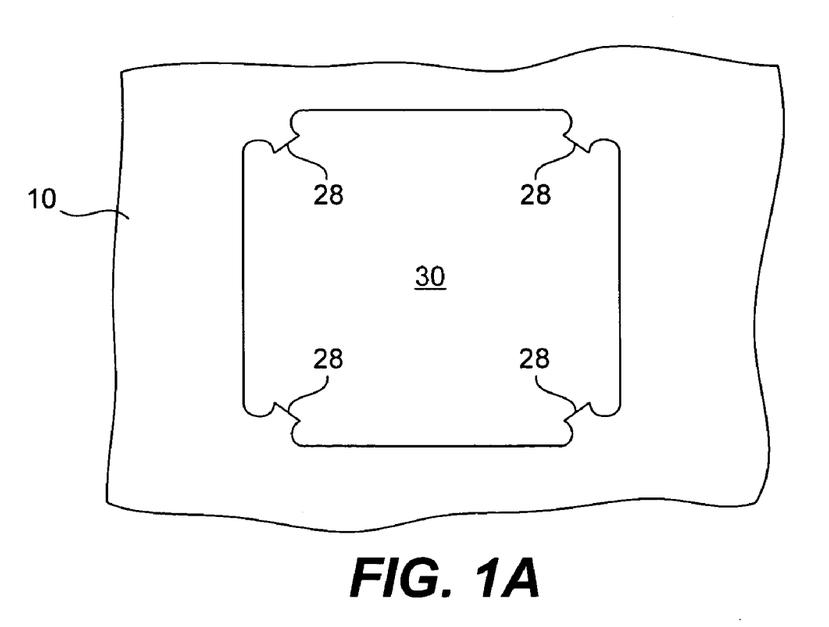
FIG. 1A illustrates an opening in the wafer carrier with tabs or flanges for receiving a wafer.

In this embodiment, each of the auxiliary frames 20, 22 is made of an electrically non-conductive material, such as fiber reinforced glass board as used in printed circuit boards or plastic material such as nylon and Teflon® resistant to the chemical baths, and each of the auxiliary boards includes metallic clips 24, 26 of 360 stainless steel, for example, which are fastened to the auxiliary boards and maintain wafers 12 in pressure engagement against flanges 28 extending from frame 10 into openings 30 from frame 10 which receive wafers 12. FIG. 1A illustrates tabs or flanges 28 in an opening 30 in frame 10. The contact areas between each wafer and the mainframe are limited to the flanges so that mechanical support for the wafer is provided exactly where pressure is applied from the clips and trapping of fluid between the mainframe and the wafer is avoided. In this way, the wafer can be dried completely during a drying cycle. Auxiliary frames 20, 22 are assembled on support frame 10 by means of fasteners, such as screws 32, 34. In other embodiments, auxiliary frames 20,22 can be made of electrically conductive material such as Kovar and provide the electrical path to the wafers during processing.

Figure 3:
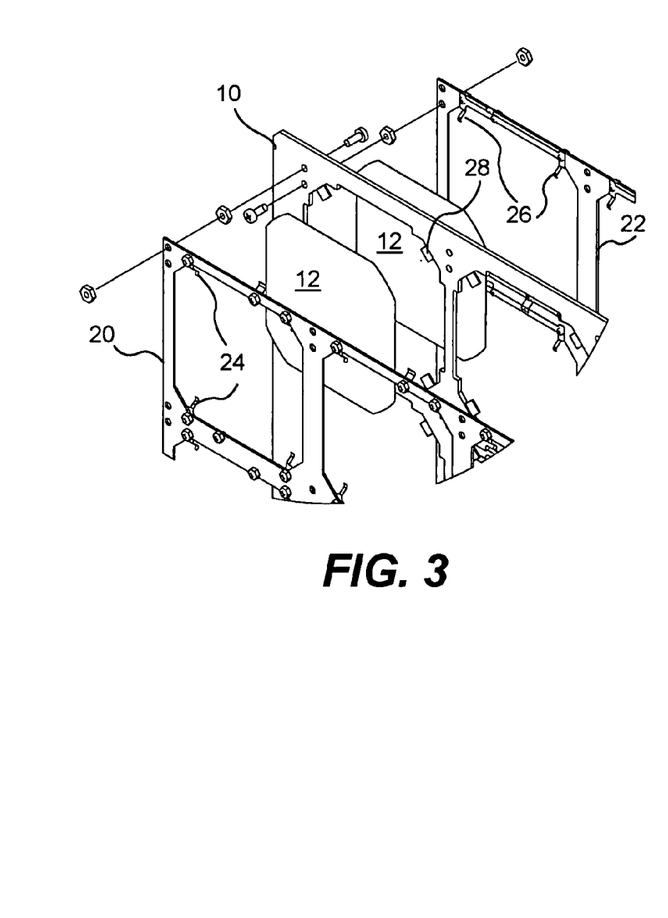
FIG. 3 is an enlarged portion of the substrate carrier of FIG. 2 illustrating the holding of a wafer in the carrier.

FIG. 3 is an enlarged view of a portion of the carrier structure of FIG. 2 further illustrating the flanges 28 extending from support frame 10 which receive wafers 12 with clips 24, 26 mounted on auxiliary frames 20, 22 maintaining the wafers in pressure engagement when loaded on frame 10.

Figure 4:
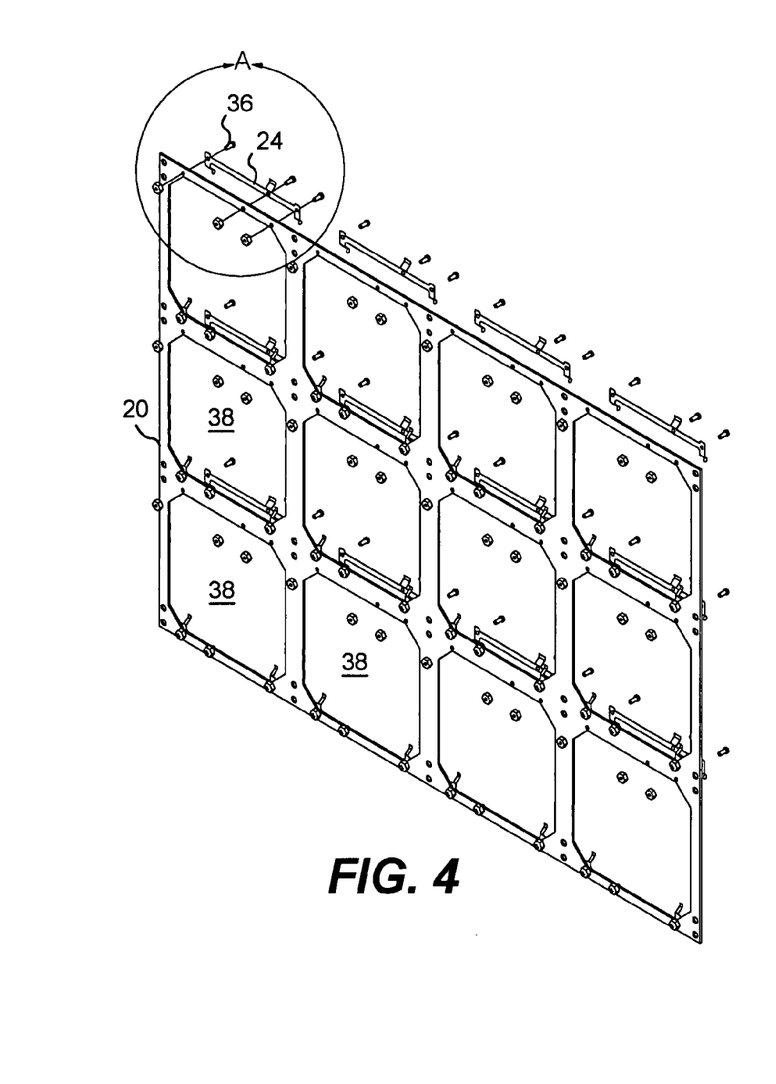
FIG. 4 is an exploded perspective view of an auxiliary frame and conductive clips mounted thereon.

FIG. 4 is an exploded perspective view of auxiliary frame 20 showing the mounting of clips 24 thereon by means of screws 36. It will be noted that auxiliary frame 20 also includes openings 38 whereby the surfaces of wafers 12 are unimpeded during the processing in a chemical bath. The positions of the clips on frame 20 affect the current flow and plating of the wafers.

Figure 5:
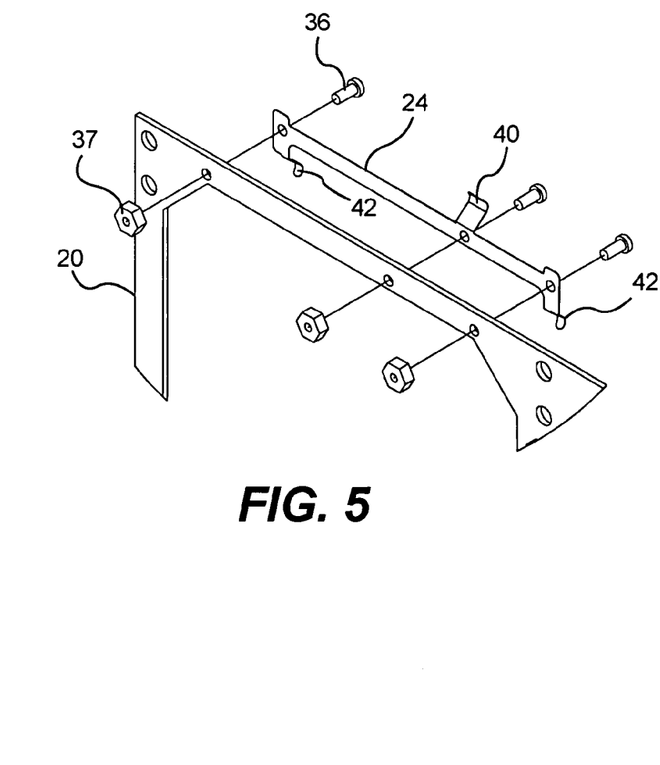
FIG. 5 is an enlarged portion of the auxiliary frame of FIG. 4 illustrating the mounting of one clip thereto.

FIG. 5 is an exploded perspective view of a portion of the auxiliary frame 20 of FIG. 4 further illustrating the mounting of clips 24 thereon by means of Teflon® screws 36 and nuts 37. Clip 24 includes a first spring member 40 which engages an electrical contact surface on support frame 10 for the communicating of electrical current to a wafer 12 by means of spring contacts 42. Since the clips are provided at the top and bottom of each wafer 12, the electrical current is uniformly distributed to the wafer during processing.

The metal clips which provide the pressure engagement for maintaining the wafers 12 on support frame 10 and for communicating electrical current from the metal frame to the wafers can assume several embodiments. For example, in FIG. 6, a clip 24' including contact 40' for engaging the support frame and contacts 42' for engaging a wafer can be mounted to an auxiliary frame by a single screw (not shown) through hole 44.

Figure 7:
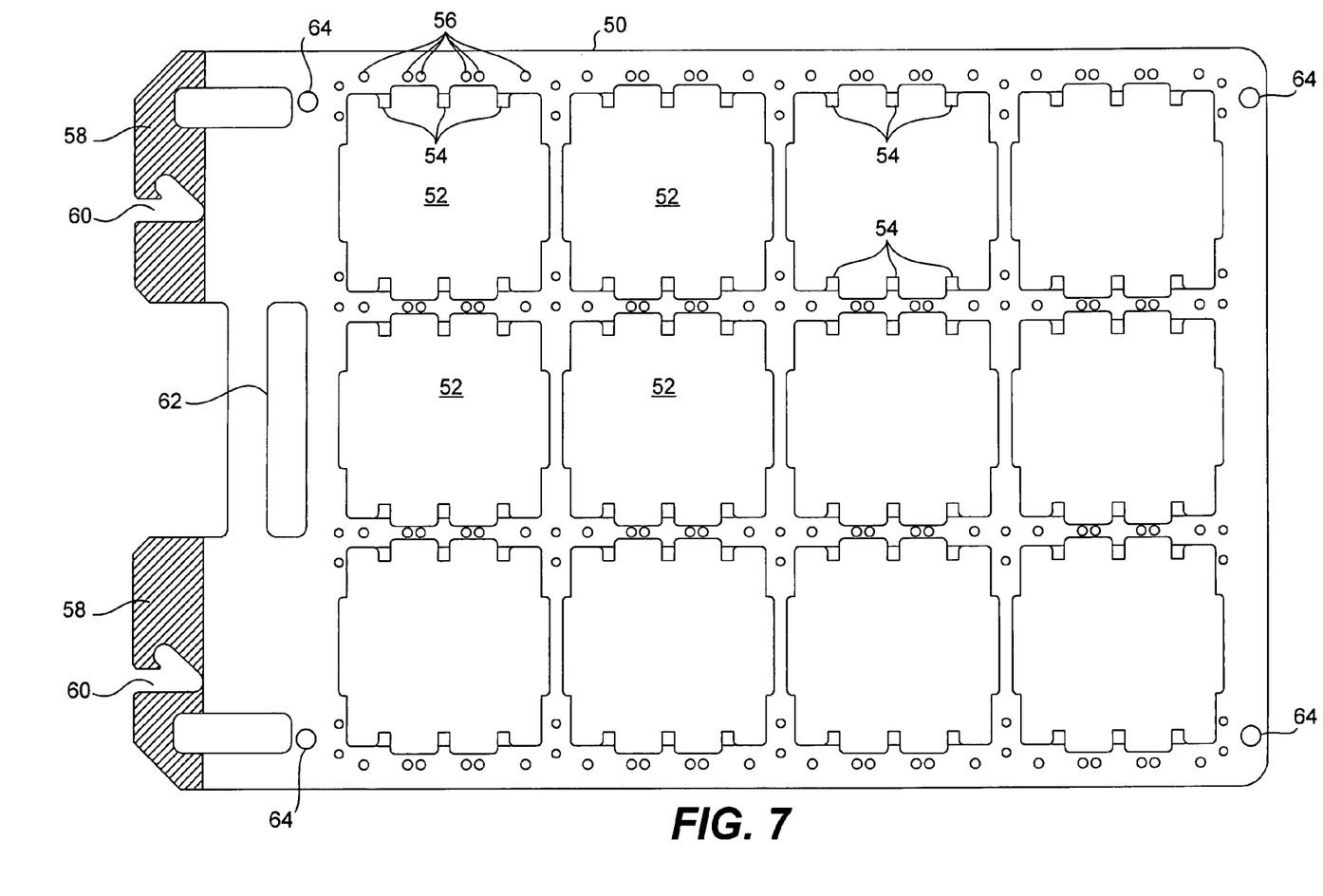
FIG. 7 is a plan view of a support frame in accordance with another embodiment of the invention.
Figure 8:
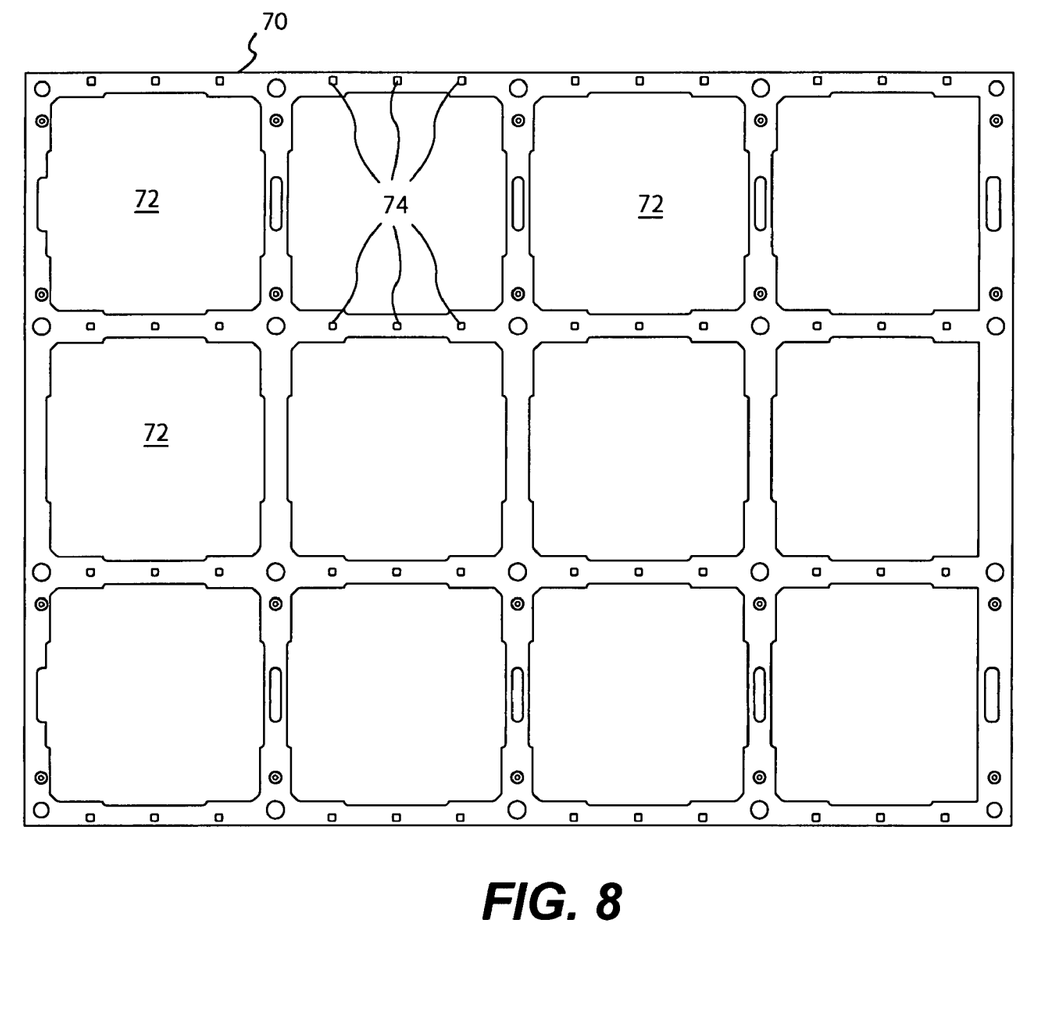
FIG. 8 is a plan view of an auxiliary frame in accordance with another embodiment of the present invention.
Figure 9A:
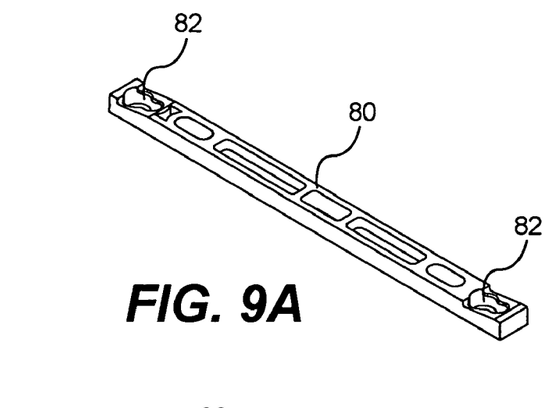
FIGS. 9A, 9B, 9C are a perspective view, side view, and top view of a slider for use in latching the support frame and one or more auxiliary frames together.
Figures 9B, 9C:
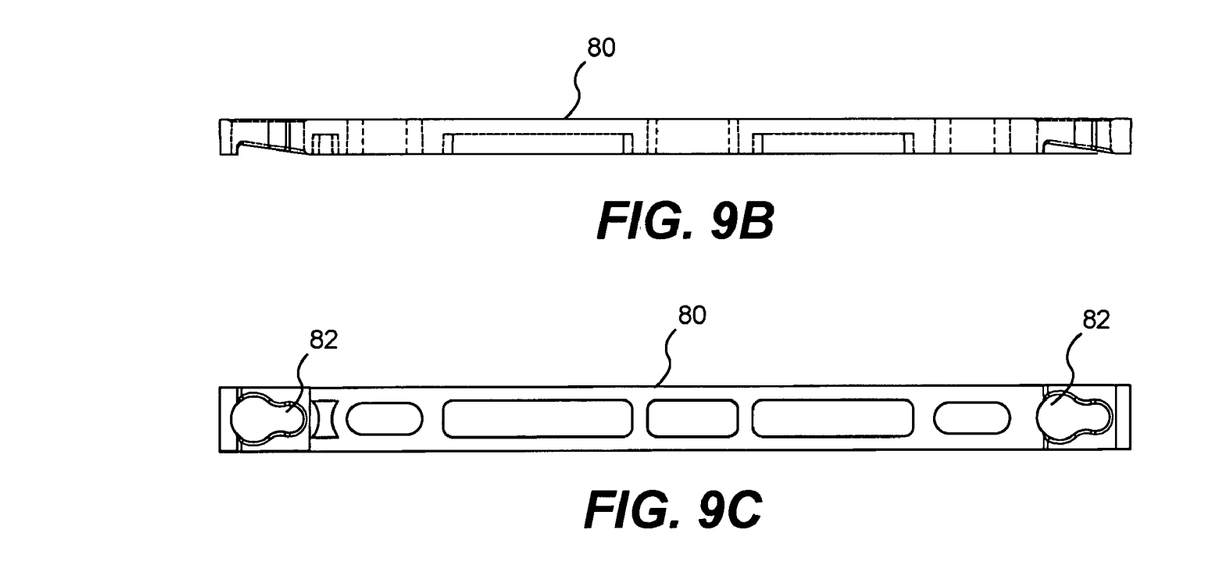
Figure 10:
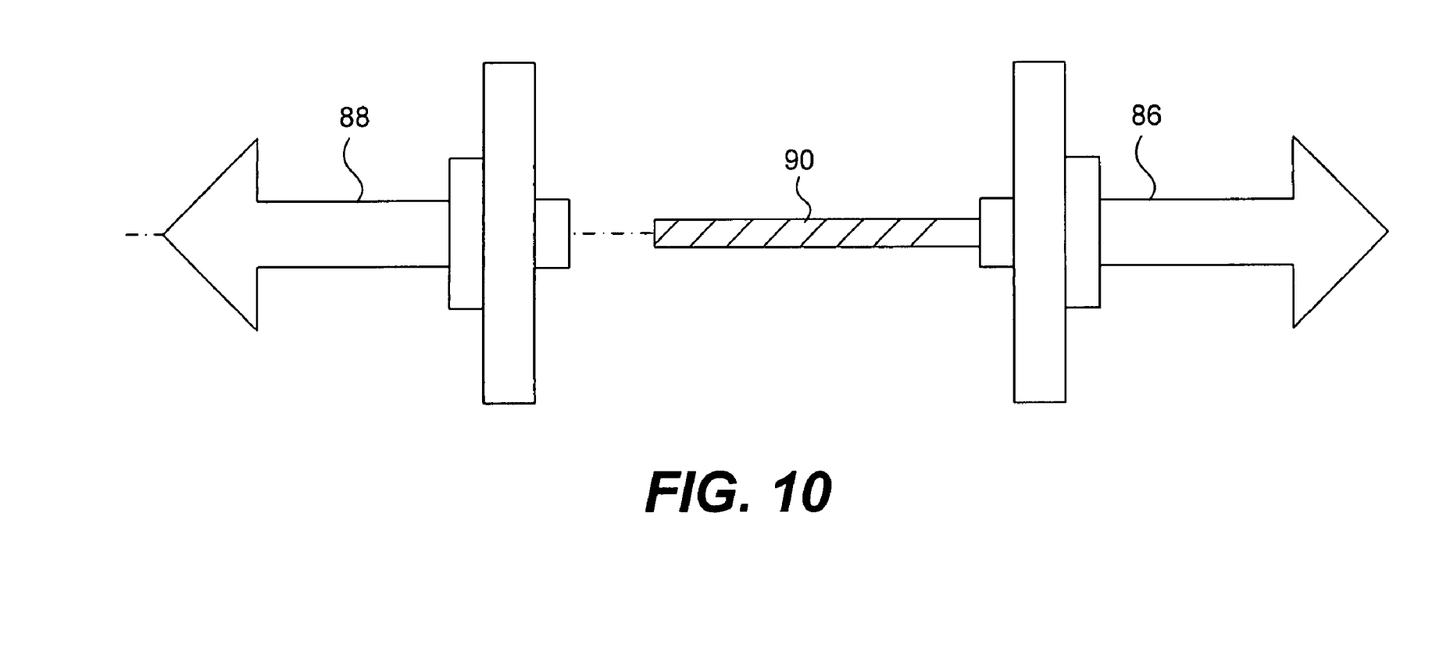
FIG. 10 is a side view of retaining pegs attached to a support frame and slidably engaged by a slider attached to an auxiliary frame.
Figure 11:
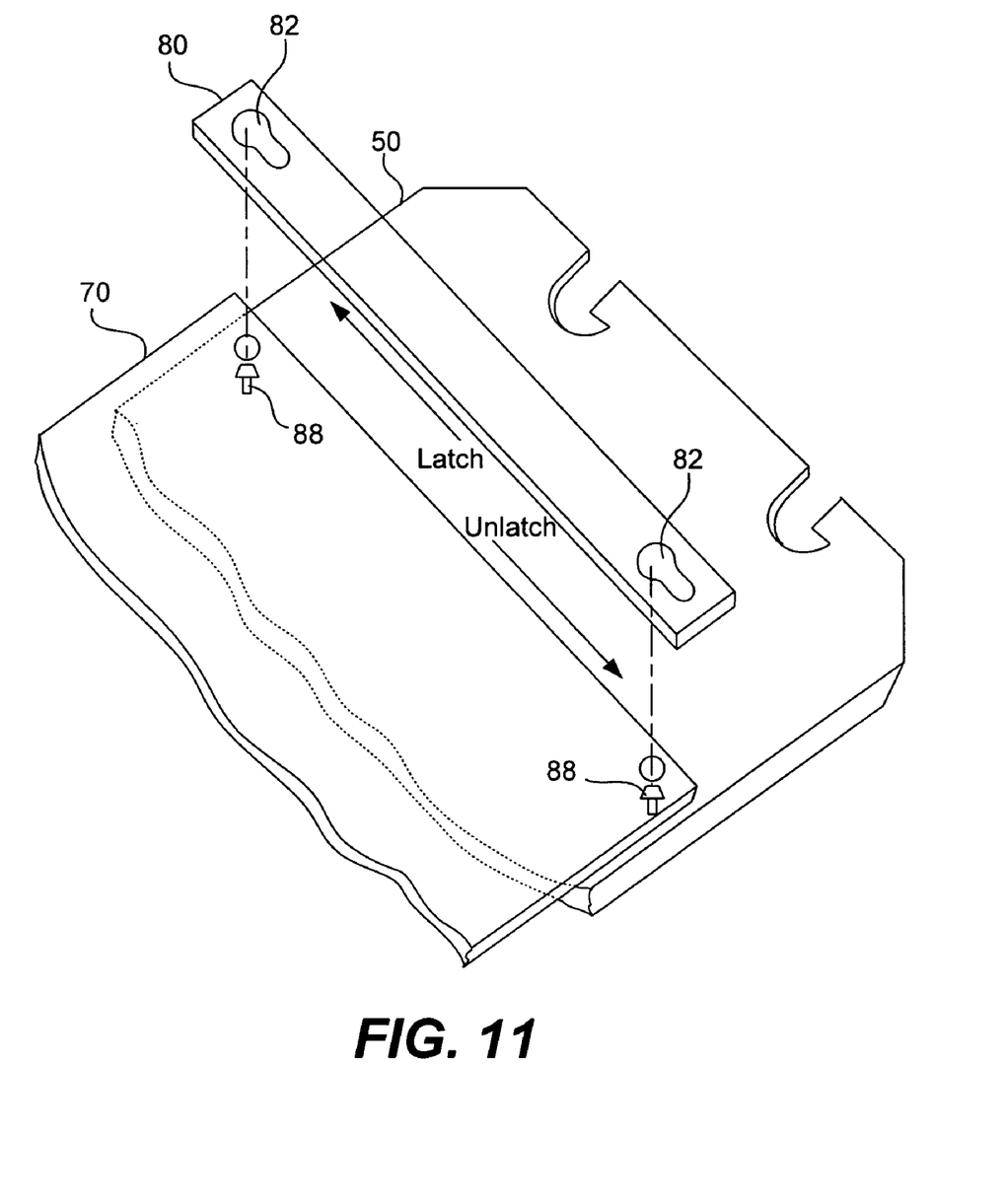
FIG. 11 is a perspective view of the latch including the slider of FIG. 9 and the retaining pegs of FIG. 10.
Figure 12:
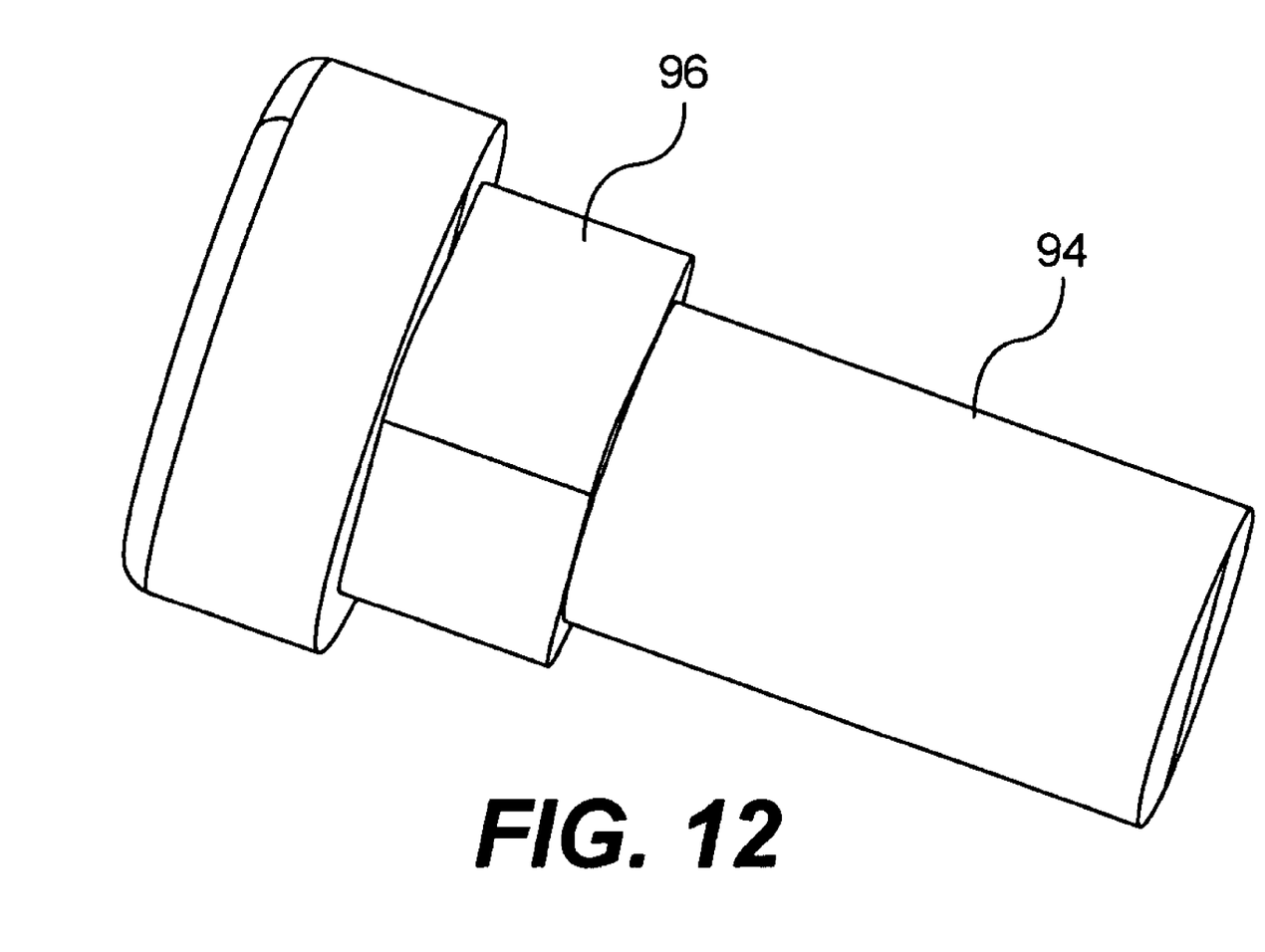
FIG. 12 is a perspective view of a heat stake bolt for use in attaching contact clips to a frame in accordance with another embodiment of the invention.
Figure 13:
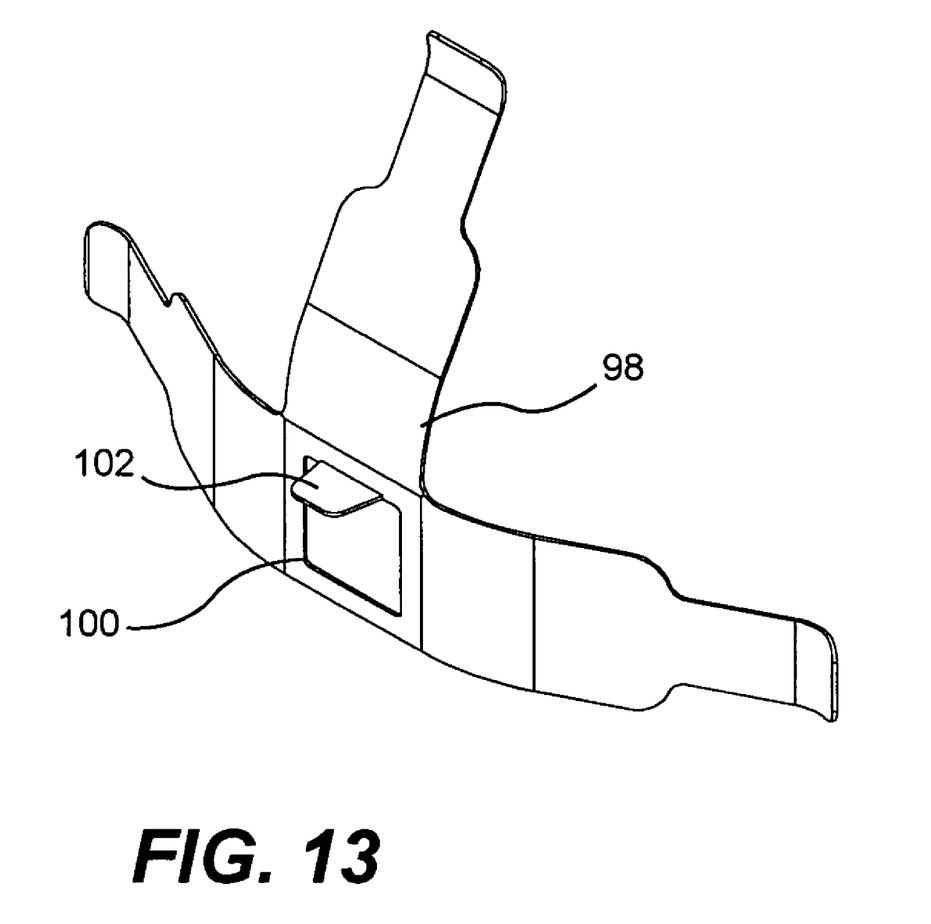
FIG. 13 is a perspective view of a contact clip attached by the heat stake bolt of FIG. 12 to the auxiliary frame of FIG. 8.

FIGS. 7–13 are drawings illustrating another embodiment of the invention including a support frame or jig as shown in the plan view of FIG. 7, an auxiliary frame or top jig as shown in FIG. 8, a latch mechanism shown in FIGS. 9–11, a heat stake fastener as shown in FIG. 12, and a clip as shown in FIG. 13.

FIG. 7 is a plan view of a support frame 50 which is similar to support frame 10 of FIG. 2 in function. Frame 50 preferably comprises a plurality of layers of stainless steel which are laminated to provide a rigid structure. Again, a plurality of openings 52 are provided in frame 50 with flanges 54 extending into the opening for supporting the semiconductor substrate. The stainless steel carrier is electrically conductive, but is coated with a chemically inert material such as Dupont Halar Teflon® material to protect the stainless steel from chemically reacting with the plating solutions and cleaning solutions. Contact points 56 are provided on the frame 50 for physical and electrical contact by contact clips mounted on the auxiliary frame (FIG. 8) for bridging electrical current from frame 50 to the substrate during electroplating. Additionally, the top of frame 50 (left side in FIG. 7) includes unplated portions 58 for connection to an external current source. Slots 60 in the top portion 58 are configured to easily engage and disengage support rods which support the loaded carrier in an electroplating bath or in a cleansing bath. Slot 62 provides a grip for manually handling the carrier during the processing operations.

Holes 64 are provided at the top and bottom of frame 50 for receiving retaining pegs (FIG. 10) which comprise a part of the latching mechanism when assembling and disassembling an auxiliary frame (FIG. 8) to support frame 50.

Referring now to FIG. 8, a plan view of an auxiliary frame 70 is illustrated. Frame 70 is similar in function to auxiliary frame 20 of FIG. 2 in supporting contact clips (FIG. 13) for engaging wafers in a loaded module carrier. Frame 70 is rigid and preferably comprises a poly-laminate material. Frame 70 has openings 72 which align with openings 52 of carrier frame 50 for exposure of the loaded substrates to processing fluid. In this embodiment, square holes 74 are provided on either side of opening 72 for receiving a heat stake bolt (FIG. 12) which fasten the contact clips (FIG. 13) to frame 70.

To facilitate attaching the auxiliary frame 50 to the support frame 70, a sliding plate as shown in FIGS. 9A, 9B, 9C is slidably attached to auxiliary frame 70 and engages retaining pegs (FIG. 10) extending from carrier frame 50. Keyhole openings 82 are provided at either end of slider 80 with the larger portion of opening 82 receiving a knob on the retaining peg, and when slider 80 is translated longitudinally, the smaller portion of keyhole opening 82 engages the knob on the retaining peg for locking the assembly. Similarly, slider 80 is laterally translated in the opposite direction for releasing the retaining peg. It will be noted in the side view of FIG. 9B that the keyhole opening has a slanting surface whereby slider 80 is in forced engagement with the retaining peg in the locked position.

FIG. 10 illustrates one embodiment of the retaining peg including a first projection 86 which extends from one side of the carrier frame for holding a first auxiliary frame and a second projection 88 extending from the opposite side of the support for retaining a second auxiliary frame. A threaded screw 90 extends from portion 86 and is received by portion 88 for fastening pieces 86, 88 to the carrier frame. The retaining peg comprises a polypropylene material which is resistant to the chemical solutions in the processing tanks.

FIG. 11 is a perspective view of the latch including the slider of FIG. 9 and retaining pegs of FIG. 10. Slider 80 retains frame 70 in engagement with modules (not shown) on support frame 50 with slots 82 receiving projection 88 of the retaining peg. Slider 80 is translated in one direction as shown to lock frame 70 on to frame 50. An opposite translation releases frame 70.

FIG. 12 is a perspective view of a heat stake bolt 94 which includes a square or polygon shaped seat portion 96 that engages square or polygon holes 74 in auxiliary frame 70 of FIG. 8. Bolts 94 retain the contact clips (FIG. 13) to auxiliary frame 70 with the barrel portion of bolt 94 heated by suitable means such as a solder gun to melt and permanently fasten the clips to plate 70. Again, the bolt is preferably made of a polypropylene material.

Figure 6:
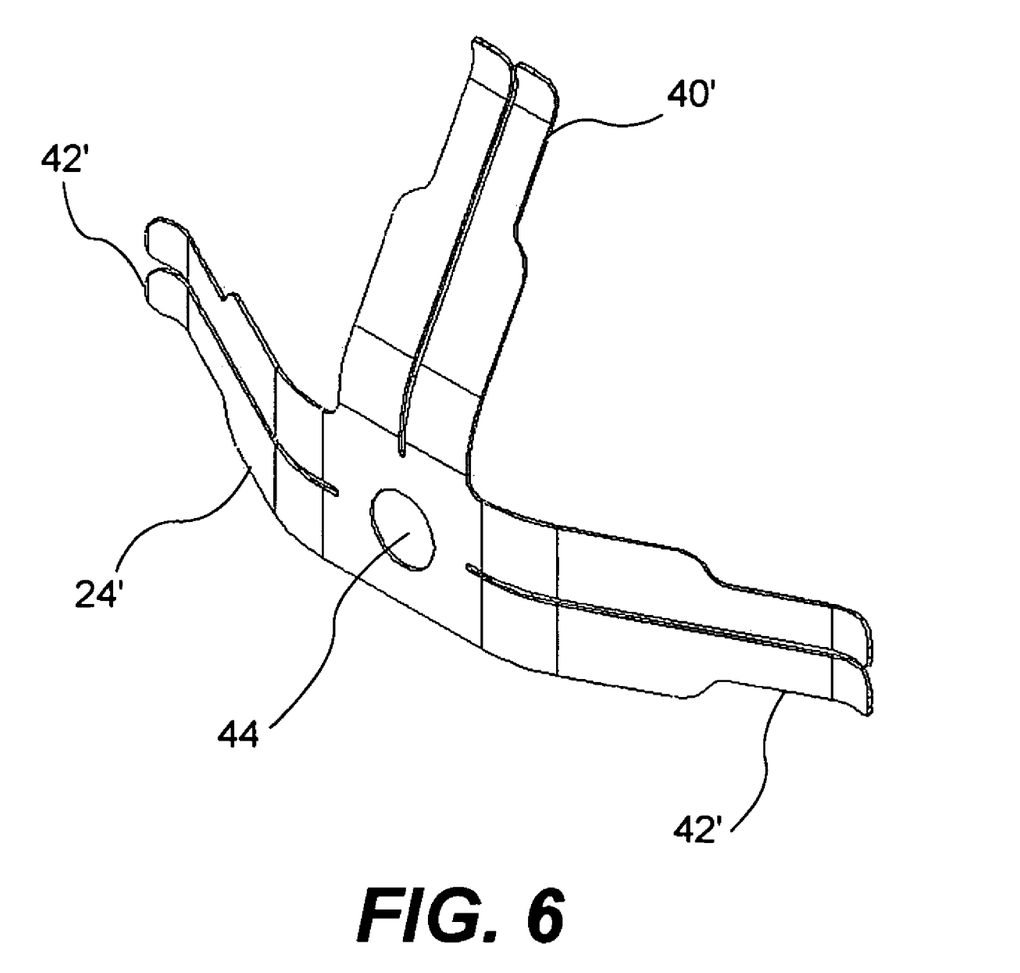
Fig. 6 is a perspective view of a clip in accordance with an alternative embodiment.

FIG. 13 is a perspective view of a clip 98 which is similar in form and function to clip 24' of FIG. 6. However, clip 98 includes a square opening 100 which mates with the square base 96 of bolt 94 (FIG. 12) to prevent rotation of clip 98 when mounted to auxiliary frame 70. Retention of clip 98 is further facilitated by the provision of a detent 102 which extends into the square hole 74 and further prevents rotation of clip 98 on frame 70.

In the described embodiments, the plating carrier or jig includes a center jig with two outside jigs that sandwich the center jig (3 piece configuration) and electrical contact fingers. The conductive center jig holds a multiple of wafers and provides the primary electrical contact between the external power supply and the contact fingers. The non-conductive outside jigs provide uniformity in shielding. The contact fingers electrically bridge the conductive center jig to the wafers. The center and outside jigs are each of single piece construction of materials that are electrically conductive or insulating as required and coated as required.

Another embodiment of the 3 piece configuration is a non-conductive center piece to hold the wafers and conductive outside jigs that contain fingers which contact the wafers. These fingers provide electrical contact and force to hold the wafers in place.

Figure 14:
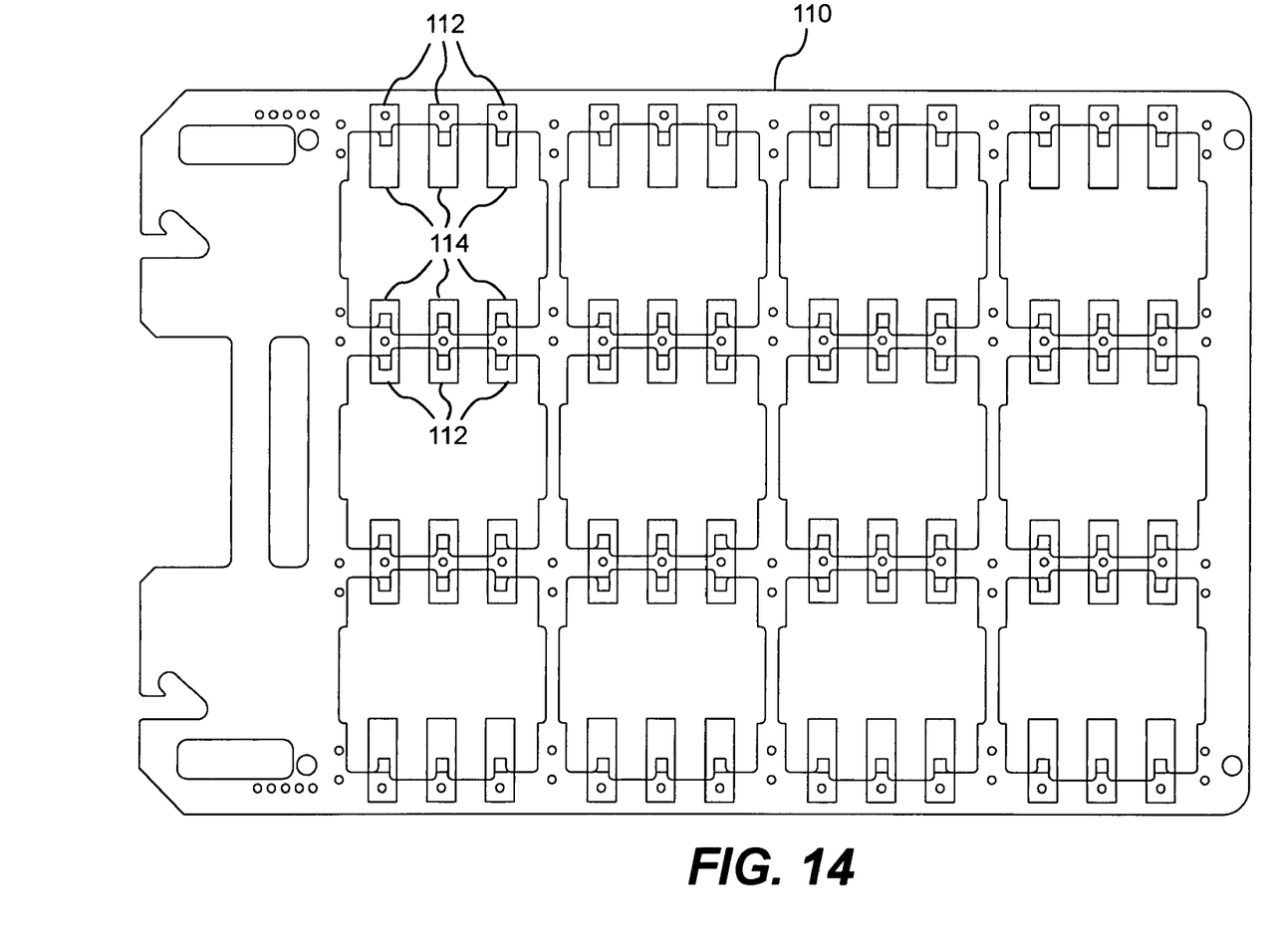
FIG. 14 is a plan view of a 1 piece substrate carrier in accordance with another embodiment of the invention.

FIG. 14 is a plan view of a 1 piece substrate carrier including a wafer carrier frame 110 similar to support frame 50 in FIG. 7 but including contact clips 112 physically and electrically attached thereto with spring members 114 extending therefrom for retaining wafers on flanges 116. Preferably, each spring member is aligned with a flange similar to the spring member clips 98 in FIG. 13. The spring members are flexed when loading and unloading wafers on the frame.

In the 3 piece configurations, the center jig or support frame may provide some or all of the following features:
a) mounting locations for wafers such that each wafer can be individually mounted and electrically contacted;
b) mounting locations for wafers such that two wafers can be mounted back to back with an open space that allows free movement of fluids between the wafers;
c) an electrical bus for carrying current between the external power supply and the wafer;
d) a electrical contact surface touching the contact finger and allowing an electrical path through the contact finger to the wafer;
e) a locating device such that the wafer does not move during processing;
f) electrical conductivity of the jig surface such that the jig surface will plate during processing and act as an anode thief to improve uniformity;
g) electrical isolation of the jig surface by coating the surface with an non conductive material such that the jig surface itself does not plate or act as an anode thief to improve uniformity; and
h) spacers which allow controlled force to be applied to all compliant contacts.

In the 3 piece configuration, the outside jigs or auxiliary frames may provide some or all of the following features:
a) masking of the wafers such that uniformity across the wafer and the jig can be modified (in the case of a conductive outer jig, this can be done with non-conductive pieces);
b) a mounting surface for the contact fingers such that the fingers can conduct current either from the outside jigs or the center jig to the wafer;
c) an electrical bus for carrying current between the external power supply and the wafer; and
d) an electrical contact surface touching the contact finger and allowing an electrical path through the contact finger to the wafer.

In the 3 piece configuration, the contact fingers may be configured such that they:
a) electrically bridge between the center jig and the wafer while being mounted on the outside jig (requires the center jig be electrically conductive);
b) electrically bridge between the outside jig to the wafer while being mounted on the center or outside jig (requires the outside jig be electrically conductive); and
c) electrically bridge between the center jig and the wafer while being mounted on the center jig (in this configuration, the outside jigs only provide shielding features while the center jig is electrically conductive).

An alternate of the 3 piece configuration is for all features of the 3 piece configuration except for masking of the wafer to be accomplished by the center jig alone. The masking may be removed as required to improve uniformity. The center jig only is used for processing (1 piece configuration). In this embodiment, the contact fingers are attached to the center jig and electrically bridge between the center jig and the wafer when being mounted on the center jig.

In both the 1 piece and 3 piece configurations, the contact fingers may be:
a) constructed from a torsion spring design with one end of the torsion spring mounted to the jig and the other end of the torsion spring configured to contact the wafer (the torsion spring may be constructed of different materials, diameters, and lengths to optimize the wafer contact);
b) constructed from a coil spring design with one end of the coil spring mounted to the jig and the other end of the coil spring configured to contact the wafer (the coil spring may be constructed of different materials, diameters, and lengths to optimize the wafer contact);
c) constructed from an upset design with one end of the contact mounted to the jig and the other end configured to contact the wafer (the upset design may be constructed of different materials, thicknesses, and lengths to optimize the wafer contact);
d) constructed of a cantilever design with one end of the cantilever mounted to the jig and the other end of the cantilever configured to contact the wafer (the cantilever may be constructed of different materials, thicknesses, and lengths to optimize the wafer contact); and
e) constructed of a cantilever design with the center of the cantilever mounted to the jig, one end of the cantilever configured to contact the jig, and the other end of the cantilever configured to contact the wafer (the cantilever may be constructed of different materials, thicknesses, and lengths to optimize the wafer contact).

In both the 1 piece and 3 piece configurations, the mounting of the wafer onto the jig may be changed to the mounting of the wafer onto one or more inserts that are attached to the jig. The insert provides a method of simplifying the jig construction and reducing cost. The insert may provide some or all of the following features:

a) mounting locations for wafers such that each wafer can be individually mounted and electrically contacted;
b) mounting locations for wafers such that two wafers can be mounted back to back with an open space that allows free movement of fluids between the wafers;
c) a press fit feature such that the insert can be pressed in location onto a simplified jig which can be made with a cheap construction process such as stamping or water jet cutting;
d) mounting locations for the contact finger such that the contact finger may be integral to the insert;
e) mounting location for the contact finger such that the contact finger bridges between the conductive jig and the wafer; and
f) a trapping position for the contact finger such that the contact finger may be held stable in contact with the wafer.

A substrate carrier in accordance with the invention is particularly advantageous in automated processing of the wafers, whereby a plurality of wafers are processed simultaneously. The mounting of the wafers on a carrier frame through use of electrically conductive clips for maintaining pressure contact with the wafers permits easy assembly and disassembly of the wafers on the carrier without undue stress being transferred to the wafers.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A carrier for use in electroplating a plurality of substrates comprising:
   a) a support frame having electrically non-conducting surfaces on which the substrates are mounted,
   b) at least one auxiliary frame for holding the substrates on the support frame,
   c) a plurality of clips extending from the auxiliary frame and engaging the substrates in pressure engagement on the support frame, and
   d) fasteners for retaining the auxiliary frame and substrates in position on the support frame.

2. The carrier as defined by claim 1 wherein the auxiliary frame is made of electrically conductive material.

3. The carrier as defined by claim 1 wherein the auxiliary frame is made of electrically non-conductive material.

4. The carrier as defined by claim 3 wherein the clips are electrically conductive and bridge current from the support frame to the substrates.

5. The carrier as defined by claim 4 and including two auxiliary frames for holding substrates on opposing surfaces of the support frame.

6. The carrier as defined by claim 5 wherein the fasteners comprise screws.

7. The carrier as defined by claim 5 wherein the clips are attached to the auxiliary frame by means of heat stake bolts having a polygon cross-section which mate with polygon openings to limit turning of the heat stake bolts on the auxiliary frame.

8. The carrier as defined by claim 5 wherein the support frame has openings where substrates are mounted.

9. The carrier as defined by claim 5 wherein the fasteners comprise retention pins extending from the support frame and slider members mounted on the auxiliary frames for slidably engaging the retention pins.

10. The carrier as defined by claim 1 and including two auxiliary frames for holding substrates on opposing surfaces of the support frame.

11. The carrier as defined by claim 10 wherein the fasteners comprise screws.

12. The carrier as defined by claim 10 wherein the clips are attached to the auxiliary frame by means of heat stake bolts having a polygon cross-section which mate with polygon openings to limit turning of the heat stake bolts on the auxiliary frame.

13. The carrier as defined by claim 10 wherein the support frame has openings where substrates are mounted.

14. The carrier as defined by claim 10 wherein the fasteners comprise retention pins extending from the support frame and slider members mounted on the auxiliary frames for slidably engaging the retention pins.

15. The carrier as defined by claim 1 wherein the support frame has openings where substrates are mounted.

16. The carrier as defined by claim 1 wherein the support frame comprises a plurality of layers of laminated stainless steel sheets.

17. The carrier as defined by claim 1 wherein the auxiliary frame comprises a laminated plastic material.

18. The carrier as defined by claim 1 wherein the support frame comprises an electrically non-conductive material and the at least one auxiliary frame comprises a an electrically conductive material.

19. A carrier for use in electroplating a plurality of substrates comprising:
   a) a support frame on which the substrates are mounted,
   b) at least one auxiliary frame for holding the substrates on the support frame,
   c) a plurality of clips extending from the auxiliary frame and engaging the substrates in pressure engagement on the support frame, and
   d) fasteners for retaining the auxiliary frame and substrates in position on the support frame the fasteners comprising retention pins extending from the support frame and slider members mounted on the auxiliary frame for slidably engaging the retention pins.

20. A carrier for use in electroplating of semiconductor wafers, such as solar cells, comprising:
   a) a support frame having openings for receiving wafers in which a plurality of semiconductor wafers can be mounted in rows and columns, each opening including an insert which engages a wafer, and
   b) a plurality of clips for retaining the semiconductor wafers in the openings of the frame.

21. The carrier as defined by claim 20 wherein the carrier and clips provide a path for electrical current to the wafers during electroplating.

22. The carrier as defined by claim 21 wherein the clips are attached to the support frame.

23. The carrier as defined by claim 21 and further including at least one auxiliary frame for use in retaining wafers on the support frame.

24. The carrier as defined by claim 23 wherein the clips are attached to the auxiliary frame.

25. The carrier as defined by claim 23 wherein the support frame comprises a plurality of layers of laminated stainless steel sheets.

26. The carrier as defined by claim 23 wherein the auxiliary frame comprises a laminated plastic material.

27. The carrier as defined by claim 23 wherein the fastener comprises retention pins extending from the support frame and a slider member mounted on the auxiliary frame for slidably engaging the retention pins.

28. The carrier as defined by claim 20 wherein each clip comprises a spring selected from the group of springs consisting of torsion spring, coil spring, upset and cantilever.

29. The carrier as defined by claim 20 wherein the support frame comprises a plurality of layers of laminated stainless steel sheets.

30. A method of electroplating a plurality of solar cell semiconductor wafers comprising the steps of:
 a) mounting the wafers with an auxiliary frame on a support frame whereby electrical current is passed through the frame to the wafers, and
 b) placing the frame and the wafers in an electroplating bath for simultaneous electroplating of all semiconductor wafers.

31. The method as defined by claim 30 wherein step a) further includes the use of clips attached to the auxiliary frame for pressure engagement of wafers on the support frame.

32. The method as defined by claim 31 wherein step b) further includes passing an electrical current through the support frame and the clips to wafers during electroplating of the wafers.

33. The method as defined by claim 31 wherein step a) further includes the use of fasteners with polygon cross-sections which mate with polygon openings to limit turning of the heat stake bolts on the auxiliary frame.

34. The method as defined by claim 33 wherein the polygon is a square.

* * * * *